United States Patent [19]
Kirchner et al.

[11] Patent Number: 5,021,365
[45] Date of Patent: Jun. 4, 1991

[54] COMPOUND SEMICONDUCTOR INTERFACE CONTROL USING CATIONIC INGREDIENT OXIDE TO PREVENT FERMI LEVEL PINNING

[75] Inventors: Peter D. Kirchner, Garrison; Alan C. Warren, Peekskill; Jerry M. Woodall, Bedford Hills; Steven L. Wright, Yorktown Heights, all of N.Y.

[73] Assignee: International Business Machines Corporation, Armonk, N.Y.

[21] Appl. No.: 322,583

[22] Filed: Mar. 13, 1989

Related U.S. Application Data

[62] Division of Ser. No. 874,738, Jun. 16, 1986, Pat. No. 4,843,450.

[51] Int. Cl.$^5$ .................... H01L 21/00; H01L 21/02; H01L 21/306; H01L 29/78
[52] U.S. Cl. .................... 437/237; 437/225; 437/228; 437/235; 437/236; 437/243; 437/244; 148/DIG. 56; 148/DIG. 81; 148/DIG. 118; 156/654; 156/655; 156/662; 427/96; 357/23.2; 357/52
[58] Field of Search .............. 437/175, 176, 225, 228, 437/235, 236, 237, 243, 244, 980; 148/DIG. 1, DIG. 17, DIG. 51, DIG. 56, DIG. 65, DIG. 81, DIG. 116, DIG. 117, DIG. 118, DIG. 139, DIG. 140; 156/654, 655, 662; 427/96, 99; 357/23.2, 52; 429/211; 204/129.3

[56] References Cited

U.S. PATENT DOCUMENTS

| | | | |
|---|---|---|---|
| 3,798,139 | 3/1974 | Schwartz | 204/56 R |
| 3,890,169 | 6/1975 | Schwartz et al. | 148/187 |
| 3,923,975 | 12/1975 | Calviello | 357/15 |
| 4,075,650 | 2/1978 | Calviello | 357/15 |
| 4,121,238 | 10/1978 | Bachmann et al. | 357/16 |
| 4,297,176 | 10/1981 | Hannah et al. | 437/184 |
| 4,351,706 | 9/1982 | Chappell et al. | 204/129.3 |
| 4,526,802 | 7/1985 | Sato | 427/39 |
| 4,597,825 | 7/1986 | Freeouf et al. | 156/643 |
| 4,645,683 | 2/1987 | Gourrier et al. | 437/241 |
| 4,706,377 | 11/1987 | Shuskus | 437/25 |
| 4,806,505 | 2/1989 | Franciosi | 437/225 |
| 4,859,253 | 8/1989 | Buchanan et al. | 437/235 |

FOREIGN PATENT DOCUMENTS

| | | |
|---|---|---|
| 54-130879 | 10/1979 | Japan . |
| 55-13925 | 1/1980 | Japan . |
| 0013925 | 1/1980 | Japan . |
| 0196201 | 8/1986 | Japan . |
| WO80/00521 | 3/1980 | PCT Int'l Appl. . |
| 2158104 | 11/1985 | United Kingdom . |

OTHER PUBLICATIONS

Ginley, D., Interfacial Chemistry at p-GaP Photoelectrodes, J. Electrochem. Soc., vol. 129, No. 9, Sep. 1982, pp. 2141-2145.
Van Meirhafghe, R., Photocurrent Oscillations at the n-GaAs/Electrolyte Interface, Electrochem. Acta, vol. 24, pp. 1047-1049, 1979.
Madou, M., Influence of Surface Damage on Stabilization Against Photodecomposition of n-Type GaAs, J. of the Electrochem. Soc. Acceler. Brief Communications, pp. 987-989, Apr. 1980.

(List continued on next page.)

*Primary Examiner*—Brian E. Hearn
*Assistant Examiner*—B. Everhart
*Attorney, Agent, or Firm*—Thomas J. Kilgannon

[57] ABSTRACT

Control of the Fermi level pinning problem and the production of flat band surface performance in compound semiconductors is achieved by providing a cationic oxide free of anionic species on the surface of the semiconductor for flat band performance and with a localized inclusion of some anionic species for barrier performance so that oxide and metal work function responsiveness is available in structure and performance in MOSFET, MESFET and different work function metal FET structures. A cationic gallium oxide is produced on GaAs by oxide growth during illumination and while being rinsed with oxygenated water. The oxidation is used to produce both anionic and cationic species while the rinsing process selectively removes all the anionic species.

8 Claims, 5 Drawing Sheets

OTHER PUBLICATIONS

Ellis, A., Study of n-Type GaAs and GAP Based Photoelectrochem. Cells. Stabil. by Kin. Control and Conversion of Optical Energy to Electricity, J. of Amer. Chem. Soc. 199.91, Apr. 27, 1977, pp. 2848–2854.

J. Vac. Sci. Technol., vol. 14, No. 4, Jul./Aug. 1977, pp. 943, "Chemical Preparation of GaAs Surfaces and Their Characterization by Auger Electron and X-Ray Photoemission Spectroscopies" by Chang et al.

Japanese Journal of Applied Physics, vol. 19 (1980), Supplement 19-1, pp. 483–487, "Selective Plasma Oxidation of GaAs—A Study of the Interface Properties," by R. P. H. Chang.

Appl. Phys. Lett. 39(9), Nov. 1, 1981, p. 727, "Schottky Barriers: An Effective Work Function Model," by Freeouf et al.

J. Vac. Sci. Technol., 19(3), Sep./Oct. 1981, p. 519, "GaAs-Oxide Interface States: Gigantic Photoionization Via Auger-Like Process", by Lagowski et al.

Appl. Phys. Lett. 48(7), Feb. 17, 1986, p. 475, "Unpinned (100) GaAs Surfaces in Air Using Photochemistry," by Offsey et al.

J. Electrochem. Soc.: Solid-State Science and Technology, Nov. 1980, p. 2488, "Oxide-Substrate and Oxide-Oxide Chemical Reactions in Thermally Annealed Anodic Films on GaSb, GaAs, and GaP," by Schwartz et al.

Appl. Phys. Lett. 46 (12), Jun. 15, 1985, pp. 1150, "X-Ray Photoelectron Spectroscopy Study of the Effects of Ultrapure Water on GaAs," by Massies et al.

J. Vac. Sci. Technol., 17(5), Sep./Oct. 1980, p. 1045, "Chemical Depth Profiles of the GaAs/Native Oxide Interface," by Grunthaner et al.

Appl. Phys. Lett. 45(2), Jul. 15, 1984, "Direct Electron Beam Writing of Gallium Oxide on GaAs (111) As Surfaces," by Alonso et al, p. 154.

J. Vac. Sci. Technol., 17(5), Sep./Oct. 1980, p. 964, "Chemical Reactions of Oxide Layers on GaAs," by Langer et al.

Ives, N., Unpinning of Fermi Level on GaAs by Flowing Water, Appl. Phys. Lett. 50(5), 2/2/87, p. 256.

Offsey et al., Unpinned (100) GaAs Surfaces in Air Using Photochemistry, 2/17/86, Appl. Phys. Lett. 48(7), p. 475.

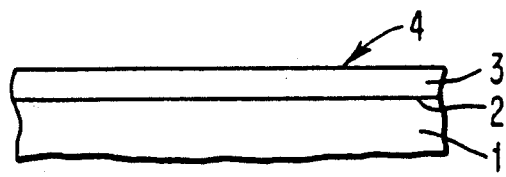
FIG. 1
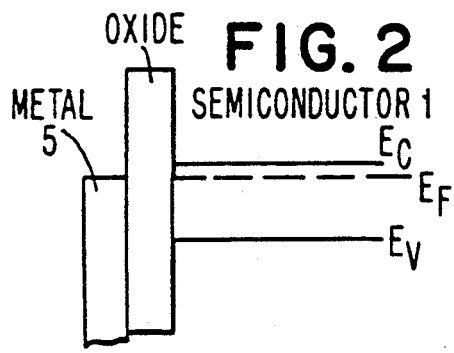
FIG. 2
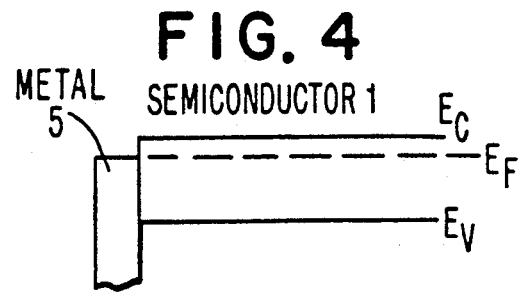
FIG. 4
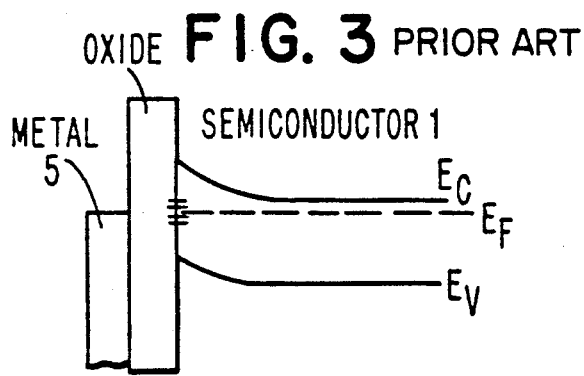
FIG. 3 PRIOR ART
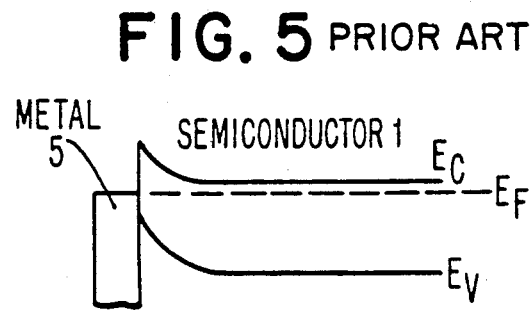
FIG. 5 PRIOR ART
FIG. 6
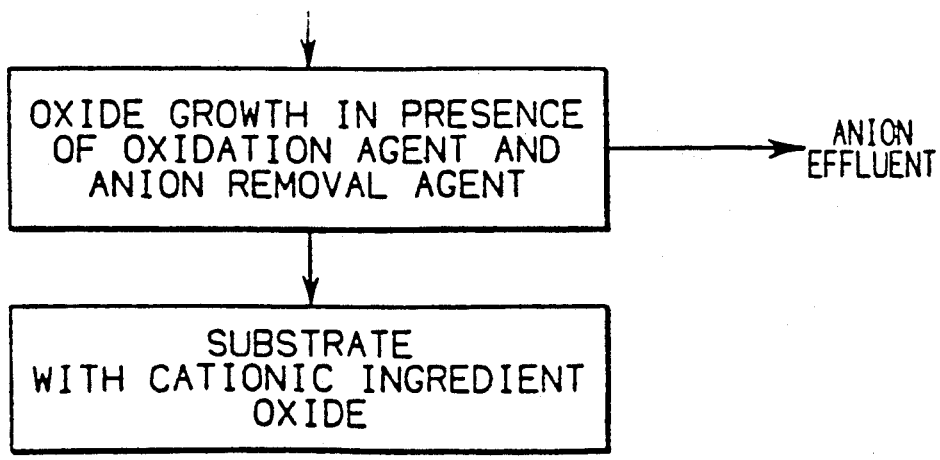

COMPOUND SEMICONDUCTOR INTERFACE CONTROL USING CATIONIC INGREDIENT OXIDE TO PREVENT FERMI LEVEL PINNING

TECHNICAL FIELD

The technical field of the invention is the formation of semiconductor circuit devices in compound type semiconductor materials. The more well known of these materials are composed of elements from Group III and Group V of the periodic table such as gallium arsenide.

This type of semiconductor, however, exhibits properties at its surface that can produce a barrier to current flow, which in turn interferes with the electrical properties of devices fabricated using these materials.

BACKGROUND ART

It is well known that for most cases of metal contacts to compound semiconductor materials the height of a Schottky barrier is independent of the electronic properties of the applied metal. This is in contrast to the ideal situation encountered for metal contacts to elemental semiconductors, such as silicon.

The familiar Schottky relationship is expressed in Equation 1 as follows.

$$\phi_{bn} = \phi_m - \chi_{sc} \qquad \text{Equation 1}$$

where $\phi_{bn}$ is the barrier height on n type material $\phi_m$ is the work function of the metal $\chi_{sc}$ is the electron affinity of the semiconductor which in turn is the energy required to remove an electron from the bottom of the conduction band to vacuum with no kinetic energy.

In the compound semiconductor/metal situation, the observed Schottky barrier height $\phi_b$ does not usually obey Equation 1.

It is recognized in the art that the insensitivity of the barrier at the metal/compound semiconductor interface to metal work functions is due to pinning at the interface of the Fermi level at a fixed energy within the band gap of the compound semiconductor material. This situation is termed "Fermi level pinning".

It is also clear that the Fermi level pinning condition is detrimental to Metal Oxide Semiconductor (MOS) structures. This is reported in J. Vac. Sci. Technol. 19 (3) Sept./Oct. 1981.

Because of the interfacial pinning, carrier flow across the interface and modulation of band bending in the semiconductor and resulting carrier density in MOS devices, cannot be easily controlled which, in turn, interferes with the performance of these devices.

Observations reported in Appl. Phys. Lett. 39, (9) Nov. 1, 1981, p.727, addressed the origin of Fermi level pinning and indicated that its presence correlated with anion clusters, for example, As in GaAs at the interface. That report further proposed an explanatory model which correlates the pinning energy with a Schottky barrier height that is consistent with the work function of the anion rich phases at the interface.

In studies reported in Japanese Journal of Applied Physics 19 (1980) Supplement 19-1, pp. 483-487, MOS structures made from gallium arsenide (GaAs) show that elemental As at the interface plays an important role in determining the electrical properties of the oxide. The electrical measurements show that excess elemental As is correlated with large trap densities and fixed states in the oxide.

Further, in studies reported in J. Vac. Sci. Technol., 14 4, July/Aug. 1977, p.943, excess As originates from a pileup of elemental As at the oxide/GaAs interface during oxide growth and that this pileup is difficult to avoid and may contribute to the band bending with stabilization of the GaAs surface potential near midgap, in other words, Fermi level pinning.

It is thus becoming clear in the art that identifying the origin of Fermi level pinning and controlling it is critical in achieving improved performance in both metal/compound semiconductor and metal/oxide/compound semiconductor devices.

BRIEF DESCRIPTION OF THE DRAWINGS

FIG. 1 is a sketch of a compound semiconductor substrate with an interface control, Fermi level pinning elimination, cationic ingredient oxide thereon.

FIGS. 2, 3, 4 and 5 are energy band diagrams illustrating and comparing the differences at the interface between the invention and the prior art.

FIG. 6 is a diagram illustrating the formation of compound semiconductor device substrates with an anion free, cationic ingredient oxide.

DISCLOSURE OF THE INVENTION

Figure 7:
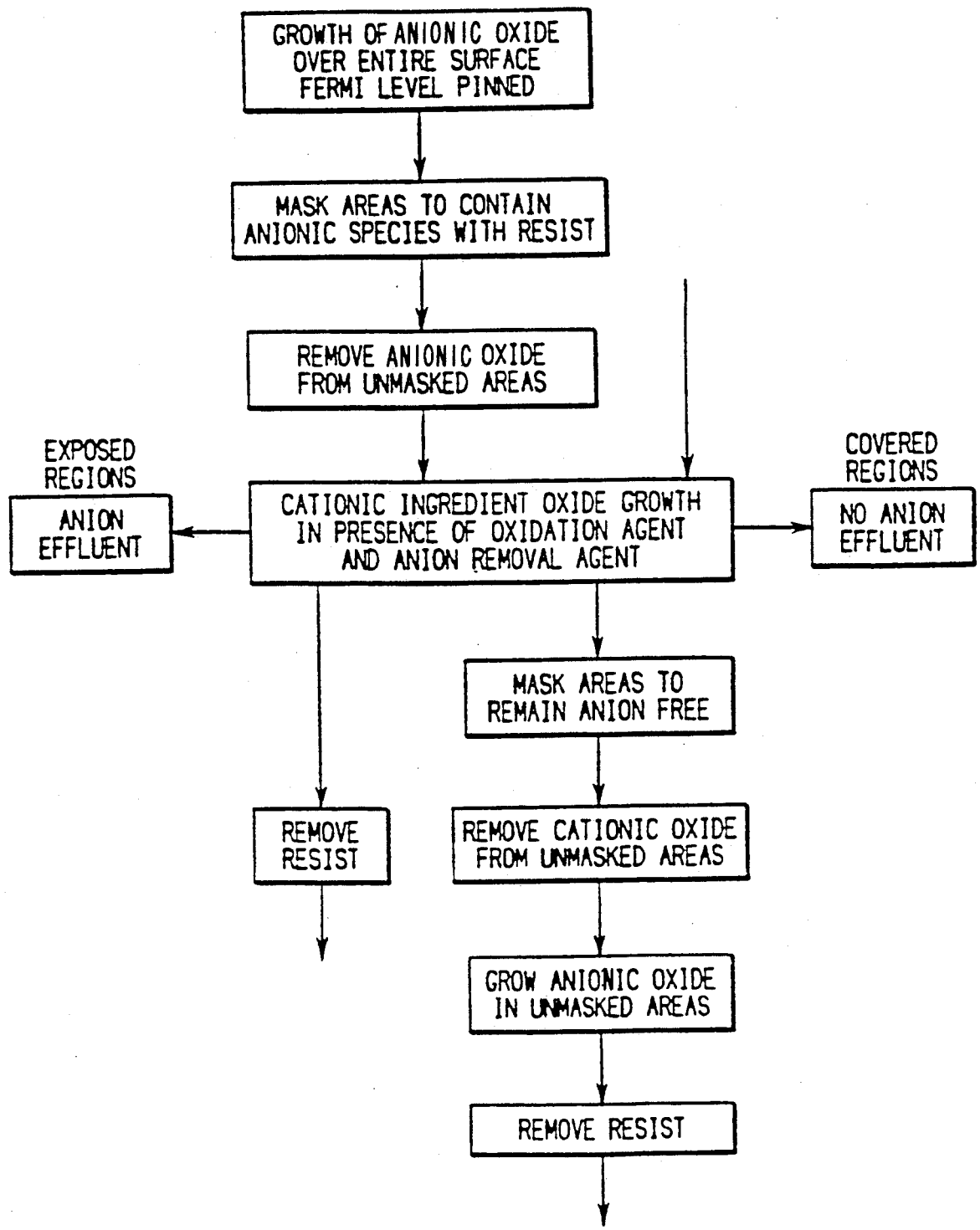
FIG. 7 is a diagram illustrating the formation of compound semiconductor device substrates with patterned, anion free, cationic ingredient oxide areas and areas of cationic oxide with localized anion content.

The invention is the formation of an anion free ingredient oxide on the surface of a compound semiconductor that eliminates the Fermi level pinning condition, making the compound semiconductor, in structure and performance, responsive to metal work function.

It should be noted that the anion ingredient of the compound semiconductor itself is excluded. For example, the As component of GaAs. The elemental As and compounds including oxides thereof on the surface that is not part of the GaAs itself is the anion species that is being controlled by providing the anion free cationic ingredient oxide.

In most semiconductor applications, the compound semiconductor is in the form of a single crystal.

The invention operates to eliminate the Fermi level pinning phenomenon by removing both anion species and all chemical species at the surface which will, upon contact with the semiconductor, cause a reaction that generates anion species and insuring their absence by an ingredient oxide that is cationic. Where Fermi level pinning is desired in a particular structure, some localized anionic content is employed.

In a compound semiconductor, the element of the lower group of the periodic table is always cationic. For examples, in the group III-V compound GaAs the group III, Ga is cationic and in the group II-VI compound CdSe the group II, Cd is cationic.

In accordance with the invention a cationic ingredient oxide is formed on the compound semiconductor substrate. This is accomplished by forming oxides containing each ingredient in the compound semiconductor and then removing all the anion containing oxides as well as any elemental anions under conditions that permit the compound semiconductor surface to be covered by a cationic ingredient oxide layer.

While many variations will be apparent to one skilled in the art, the description will be correlated for purposes of illustration with respect to the group III-V compound semiconductor GaAs having n type conductivity. The various transformations to other materials and conductivity type can readily be made in the light of the principles set forth. In the illustrative GaAs material, the anion is As, and there are many anion ingredient oxides, such as $As_2O_3$ and $GaAsO_4$, as well as cation ingredient oxides of Ga such as $Ga_2O_3$.

The reaction may be expressed as in Equation 2 using the example Group III-V compound semiconductor.

  Equation 2 where

III-V is the compound semiconductor

V is a Group V element, i.e., As $V_{ox}$ is an oxide of the Group V ingredient, i.e., $As_2O_3$ and $III_{ox}$ is an oxide of the Group III ingredient, i.e., $Ga_2O_3$ In Equation 2 when the free energy $\Delta F$ is less than zero, all phases will appear when the reactions start from the left side of the equation. Since $\Delta F$ is less than zero for most compound semiconductors and since it is known that the presence of $V_{ox}$ and V are detrimental for certain device applications, it is necessary to selectively remove $V_{ox}$ and V so that only $III_{ox}$ remains under equilibrium conditions. In addition, there may be other chemical species that will react with the compound semiconductors to create V or $V_{ox}$ and these must be removed as well, or prevented from contacting the semiconductor by the layer of $III_{ox}$ that is formed.

In the material GaAs, the presence of the anionic arsenic oxide and the anion arsenic at the surface interface is the source of the problem, the Fermi level pinning phenomenon.

The term anion free cationic ingredient oxide shall be defined as a cationic oxide of the lowest group ingredient of the compound semiconductor that has less than 2% concentration of anion species on the surface.

In this invention, the Fermi level pinning is eliminated by providing the surface of the compound semiconductor with a cationic ingredient oxide. For many applications, including that of an intermediate wafer product with relaxed environmental constraints between processing operations, the oxide layer will be a layer of cationic oxide that is completely free of anionic species. In some applications where some Fermi level pinning is useful, localized anionic species may be included in the cationic oxide layer.

In accordance with the invention, this is accomplished by providing an oxidizing agent during growth that promotes the formation of oxides of each and every ingredient. In the case of GaAs, oxides of As, elemental As and oxides of Ga are formed. As the oxidation progresses in accordance with the invention, there is provided a selective removal agent that operates to remove the anionic species, such as As and the oxides of As, leaving behind the cationic species, the oxides of gallium. Such agents are treated in textbooks directed to aqueous solution chemistry, such as "An Atlas of Electrochemical Equilibrium in Aqueous Solutions", published by the National Association of Corrosion Engineers, Houston, Tex. 1974, and one skilled in the art in the light of these principles can readily establish the requirements in different material systems. For the material GaAs, light is an agent that promotes oxidation, and oxygenated water will serve as a selective anionic species removal agent, that is to say it dissolves $As_2O_3$ and As.

Referring to FIG. 1, a substrate 1 of a compound semiconductor, for example, GaAs, has an interface 2, and thereover a layer 3 with an exposed surface 4 of a cationic oxide that is free of anionic species. In the case of the illustrative material GaAs, the layer 3 is of gallium oxide.

Considering next a situation for the example material GaAs, where for device structure for performance purposes, it may be desirable to have some Fermi level pinning in a localized area. This could be achieved in connection with FIG. 1 by providing a patterned resist that keeps the anion species removal agent from eliminating all anion species in the desired localized areas so that layer 3 becomes a cationic ingredient oxide with anionic localized inclusions.

Referring to FIGS. 2 and 3, these are energy band diagrams of the interface 2 for n-type GaAs. In FIG. 2, a low work function, that is $\phi_m$ is approximately equal to $\chi_{sc}$, is applied to the surface 4. Under these conditions, in accordance with the invention, the band edges, in the presence of the anion free, cationic oxide, at the interface 2, commonly known as flat band, will remain level and have approximately the same value as that in the bulk. This unpinned energy band diagram is illustrative of conditions preferred for Metal Oxide Semiconductor (MOS) type devices because it facilitates carrier modulation through an electrode 5.

Whereas in the presence of an anionic oxide, including anion inclusions as in the prior art, the band edges would rise to the standard pinning well known in the art, and undesirable because it inhibits carrier modulation by a control electrode, such as metal 5, and shown in FIG. 3 with undesirable interface states labelled prior art.

Referring to FIGS. 4 and 5, these are energy band diagrams where the cationic oxide layer is of tunneling dimensions of the order of 10 to 50Å for n type GaAs. In FIG. 4 a low work function metal 5, that is a metal where $\phi_m$ is approximately equal to $X_{sc}$, is applied to the surface 4. Under these conditions, in accordance with the invention, the band edges in the presence of the anion free cationic oxide at the interface 2 will remain level, commonly known as flat band and will have approximately the same value as that in the bulk.

This energy band diagram is that for an ideal ohmic contact useful in a large variety of semiconductor device applications.

Whereas in the presence of an anionic oxide or with anion inclusions as in the prior art, the band edges would rise to the standard pinning position well known in the art and shown in FIG. 5 labelled prior art.

For example, for a surface 2 coated only with anion free, cation oxide 3, for example, n type GaAs with a $Ga_2O_3$, a low barrier will be produced at interface 2 when surface 4 is coated with a low work function metal 5 for example Al. Whereas for the same layer 3, a high barrier will be produced at interface 2 when surface 4 is coated with a high work function metal 5, for example Au.

For another example where anion is locally included in the cation oxide 3 application of a metal 5 with a low work function, for example Al, on surface 4, will result in a high barrier in the region containing the anion whereas there will be a low barrier in the anion free region.

It will be apparent to one skilled in the art in the light of these principles that through the choice of metal 5 work function in conjunction with anion ingredient or purely cationic oxide, a selectable Schottky barrier contact may be produced. This capability is useful in Metal Semiconductor Field Effect Transistor (MESFET) structures.

Referring next to FIG. 6, a diagram is provided illustrating the formation of an anion free cationic ingredient oxide covered compound semiconductor substrates in which, in general, an oxide layer as 3 in FIG. 1 is grown under conditions that produce oxides of all ingredients of the compound semiconductor and simultaneously the growth continues in the presence of an agent that removes the anion species which passes off as an effluent.

For the material GaAs, an agent for the oxidation is the combination of light and water and an agent for the selective removal of the As species is flowing oxygenated water. Since flowing water alone will slowly remove gallium oxide, it is necessary that the oxidation rate be larger than the removal rate for oxide growth to occur.

Where all of the anion species is removed, the resulting substrate has an anion free cationic ingredient oxide covering which then has a resistance to anion oxidation in the shelf time between processing operations.

Where it is desirable that there be a patterned surface of Fermi level pinned and unpinned regions, the pattern may be formed either by selectively removing all anionic species from regions with a desired pattern or by introducing anionic species in a selective pattern. Either process will result in an oxide layer on the surface with areas which have only cationic oxide present and also areas which have localized inclusion of anionic species. This is illustrated in FIG. 7. In FIG. 7 on the left side of the diagram, patterned unpinning is achieved by first growing on a substrate, such as a wafer, an anodic oxide by conventional means. Such oxides contain anionic species and exhibit Fermi level pinning. Unpinned regions are then formed by masking with a resist the desired to be pinned areas, removing the anionic oxide in the unmasked areas and then growing an unpinned cationic oxide in accordance with the invention. The resist is then removed and a wafer having patterned localized anion inclusions on a cationic ingredient oxide is the result.

In FIG. 7 on the right side of the diagram, the entire surface is first cleaned. An unpinned cationic ingredient oxide layer is then grown in accordance with the invention. The areas to remain anion free are then masked. The cationic oxide is removed from the unmasked areas followed by removal of the resist so that a substrate having patterned localized anion inclusions is the result.

Figure 8:
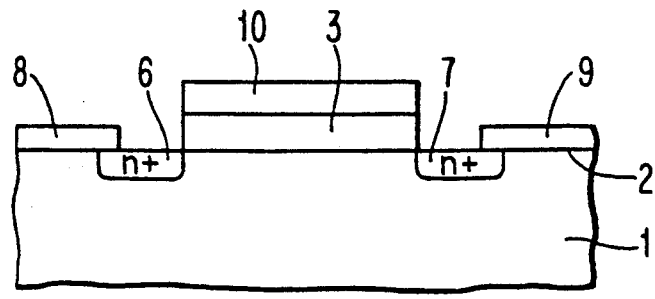
FIGS. 8, 9 and 10 are devices illustrating the structural and performance control employing the Fermi level pinning elimination, cation ingredient oxide of the invention.
Figure 9:
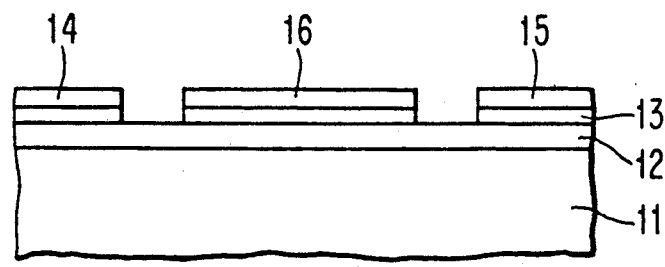
Figure 10:
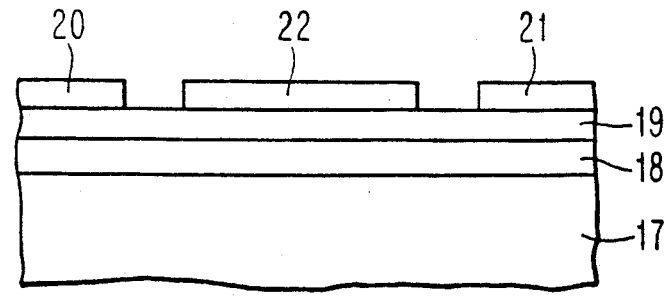

In FIGS. 8, 9 and 10, illustrations are provided of device structures which utilize the control capabilities achieved by the responsiveness to metal work function of a semiconductor surface with an unpinned Fermi level at an oxide interface.

Referring to FIG. 8, a MOSFET type device is illustrated where on a compound semiconductor, for example GaAs, substrate such as 1 in FIG. 1, on the interface 2 a layer of anion free cationic oxide 3 is provided having a thickness compatible with standard signal levels for current influencing in the area of said substrate 1, for example 1000Å. High conductivity n+source 6 and drain 7 regions are formed with metal external electrodes 8 and 9 to the source 6 and drain 7, respectively, and over the oxide 3, which together with the metal 10 serves as the gate. In accordance with the invention, the gate 10 will exhibit the characteristics illustrated in connection with the flat band interface of FIG. 2 rather than the prior art situation of FIG. 3 with the interface states that produce undesirable traps. Further, in accordance with the invention, the ohmic contact between the source 6 and metal electrode 8 and drain 7 and metal electrode 9 will exhibit the characteristics illustrated in connection with the flat band interface of FIG. 4 rather than the prior art situation of FIG. 5 where the Fermi level pinning operates to produce a barrier which introduces undesirable resistance into the ohmic contacts.

Referring next to FIG. 9, a Metal Semiconductor Field Effect Transistor (MESFET) type device is illustrated where on a compound semiconductor, for example GaAs, substrate 11 that is semi-insulating as is standard in the art, there is provided a channel layer 12 of n conductivity type doped to about $2 \times 10^{17}$ atoms/cm$^3$ about 1000Å thick. In accordance with the invention, a layer 13 of cationic ingredient oxide is provided on the surface of the layer 12. The oxide 13 is of quantum mechanical tunneling thickness, that is approximately 50Å thick. In the areas under the source 14 and drain 15 contacts the oxide 13 is cationic and completely free of anion species so that the Fermi level at the surface of the layer 12 is unpinned whereas in the region under the gate 16 the oxide 13 contains a localized inclusion of anion species to produce localized pinning and a selected height barrier. The source 14, drain 15 and gate 16 metal are the same low work function ($\phi_m$) such as Al. In the structure of FIG. 9, the source 8 and drain 9 contacts provide barrier free electrical behavior where the cationic oxide provides the flat band of FIG. 2 yet the oxide 13 being sufficiently thin for quantum mechanical tunneling provides a low impedance contact. Further, the localized anion inclusion in the oxide 13 under the gate metal contact 16 permits sufficient band bending that a rectifying gate contact is provided to the field effect transistor.

In FIG. 10, a field effect type transistor is illustrated in which, in accordance with the invention with the Fermi level pinning control oxide, a difference in work function of metal provides structural and performance functions.

Referring to FIG. 10, on a compound semiconductor, such as GaAs substrate 17 that is semi-insulating as is standard in the art, a device layer 18 is provided of n conductivity type doped to the order of $2 \times 10^{17}$ atoms/cm$^3$. An anion species free cationic ingredient oxide layer 19 that is of the order of 50Å thick so that quantum mechanical tunneling can occur is provided over the layer 18. Source 20 and drain 21 metal contacts are applied using a low work function ($\phi_m$) metal such as Al. These contacts will exhibit low impedance ohmic behavior because the oxide 19 will insure a flat band surface. The gate metal contact 22 is of a metal with a higher work function ($\phi_m$) than that of the metal used for contacts 20 and 21, for example Au, so that with the oxide 19 the performance is in accordance with Equation 1 and the higher work function metal 22 provides the desired barrier for a field effect transistor gate.

BEST MODE FOR CARRYING OUT THE INVENTION

Figure 11:
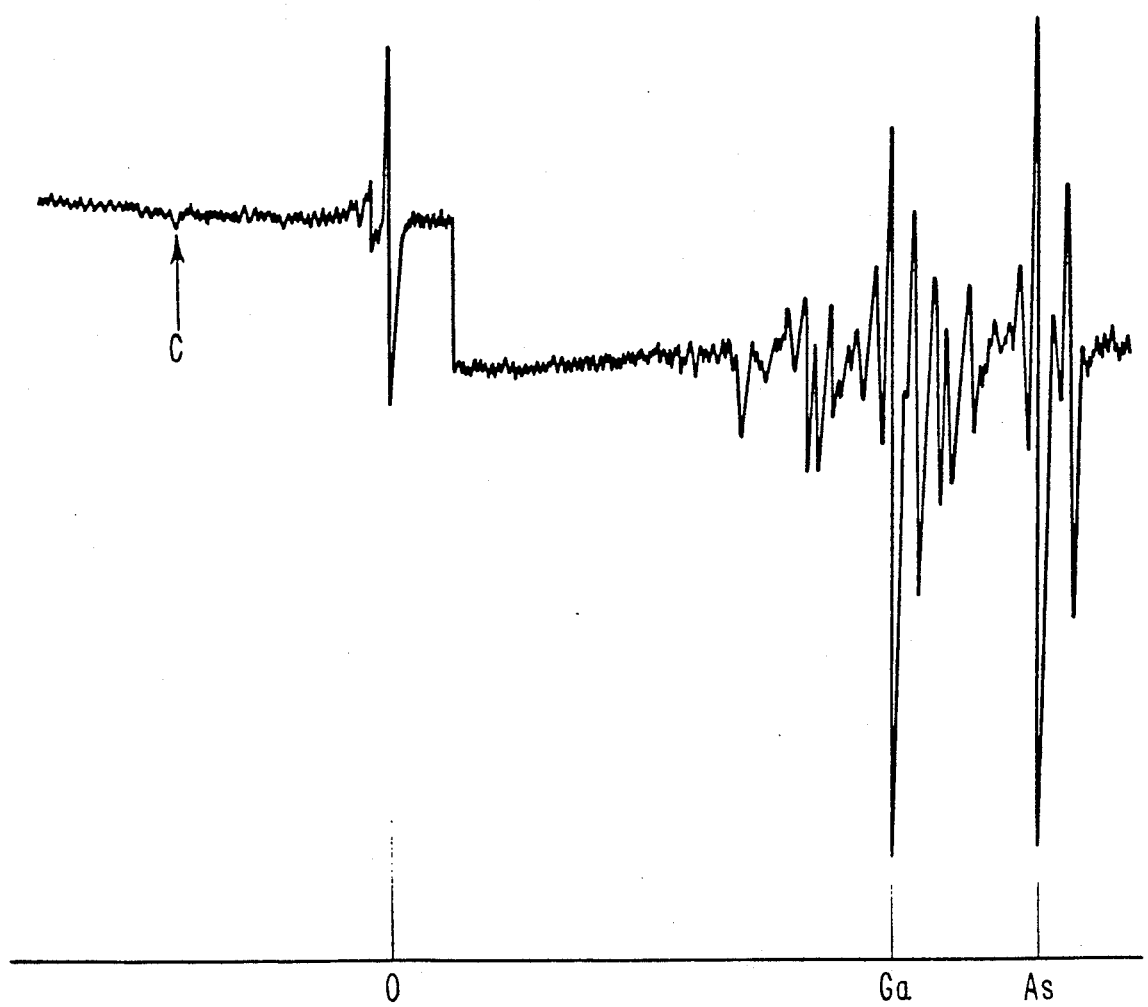
FIGS. 11 and 12 are illustrations of Auger electron spectroscopic data comparing, for a surface of the material GaAs, a native oxide, showing the presence of As with a GaAs surface after oxidation and As removal.

Referring to FIG. 11, an Auger electron spectroscopy of the GaAs surface demonstrates the presence of the anion species As.

Figure 12:
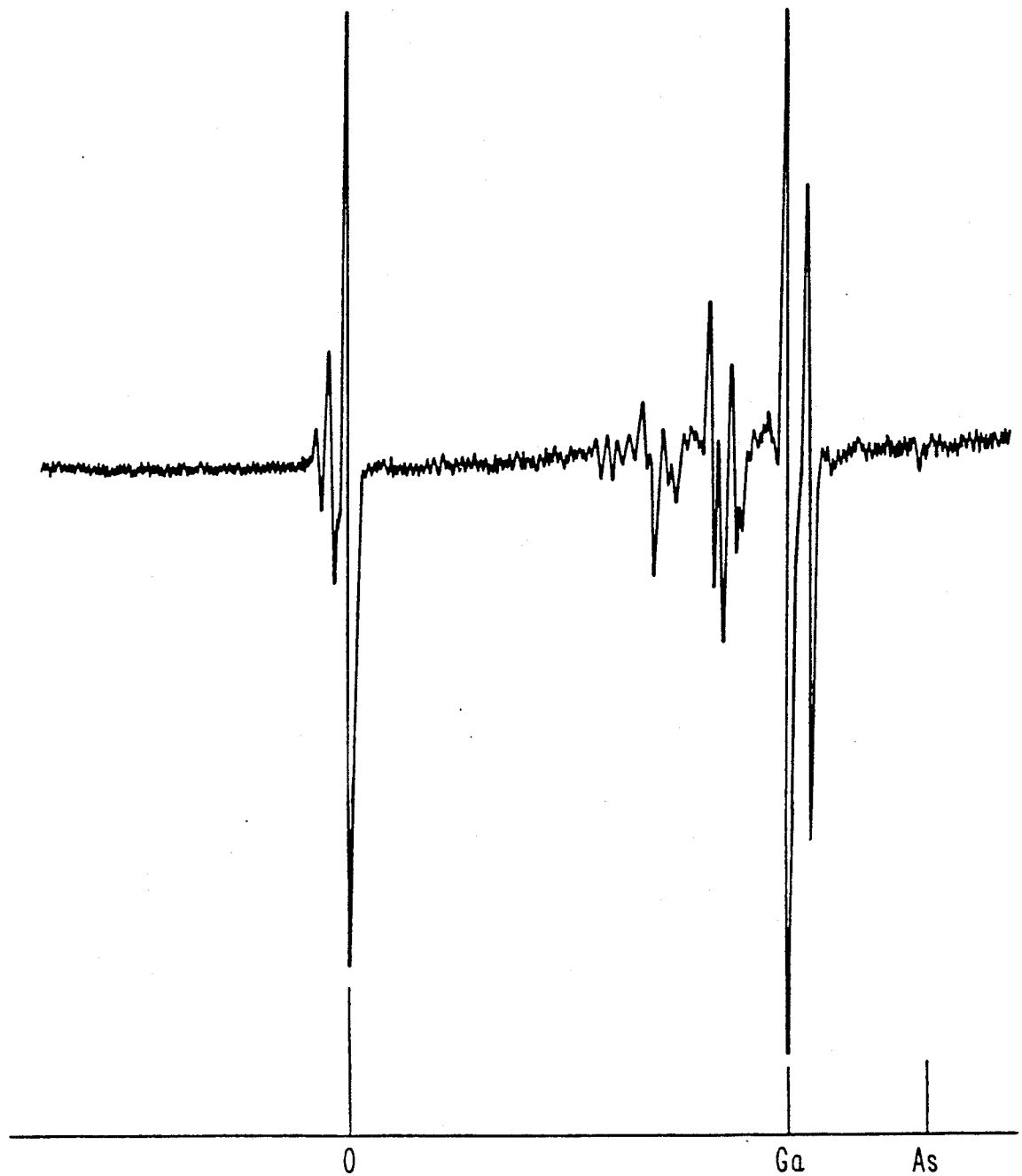

The preferred material is gallium arsenide (GaAs). A GaAs wafer has typical $2 \times 10^{17}$ atoms/cm$^3$ n conductivity type layer over a semi-insulating substrate. It is first cleaned in hot sulfuric acid and water (1:1) to generate a clean starting surface. The wafer is immersed in flowing oxygenated deionized water and illuminated by an intense light source, such as a quartz halogen projection bulb. An Auger electron spectrum of the resulting cationic ingredient oxide on the surface is shown in FIG. 12 to contain less than 2% anion As species and when compared with FIG. 11, the cationic ingredient oxide is anion free. The wafer exhibits the flat band surface behavior of FIGS. 2 and 4 providing structure and performance responsiveness to oxide and metal work function variations.

What has been described is the control of the Fermi level pinning phenomenon in a compound semiconductor by providing an anion free cationic ingredient oxide on the surface thereof that brings the band bending close to the flat band condition so that the resulting semiconductor device can demonstrate oxide and metal work function responsiveness in structure and performance.

Having thus described our invention, what we claim as new and desire to secure by Letters Patent is:

1. The process of providing a cationic ingredient oxide on a surface area of a compound semiconductor member comprising in combination the steps of:

growing on said surface area, in the presence of an oxidation enhancement agent, a composite oxide of oxides of each ingredient of said compound semiconductor member while simultaneously subjecting said surface area and said composite oxide to an anionic species removal agent to remove said anionic species leaving said cationic ingredient oxide.

2. The process of claim 1 where said compound semiconductor is GaAs, said cationic ingredient oxide is an oxide of gallium and said anionic species is the oxides of arsenic and arsenic ions.

3. The process of claim 2 where said oxidation enhancement agent is light.

4. The process of claim 3 wherein said anionic species removal agent is oxygenated water.

5. The process of claim 1 providing for localized anionic oxide inclusions including the steps of masking at least one area to remain anion free, removing said cationic ingredient oxide from unmasked areas, growing anionic oxide in unmasked areas and removing the masking material.

6. The process of claim 5 where said compound semiconductor is GaAs.

7. The process of providing a compound semiconductor member with areas of cationic ingredient oxide and with localized inclusions of anionic oxide comprising in combination the steps of:

growing an anionic oxide over said semiconductor member, masking with a resist areas to contain anionic species, removing said anionic oxide from said unmasked areas, growing a cationic oxide in the presence of an oxidation agent and an anion removal agent, and removing said resist.

8. The process of claim 7 where said compound is GaAs.

* * * * *